(12) United States Patent
Andreassen

(10) Patent No.: US 6,356,458 B1
(45) Date of Patent: Mar. 12, 2002

(54) EXTREME DENSITY PACKAGING FOR ELECTRONIC ASSEMBLIES

(75) Inventor: Trygve Andreassen, Highlands Ranch, CO (US)

(73) Assignee: Lockheed Martin Corporation, Bethesda, MD (US)

(*) Notice: Subject to any disclaimer, the term of this patent is extended or adjusted under 35 U.S.C. 154(b) by 0 days.

(21) Appl. No.: 09/524,926

(22) Filed: Mar. 14, 2000

(51) Int. Cl.[7] .............................. H05K 7/02; H05K 7/04
(52) U.S. Cl. ........................ 361/807; 361/735; 361/715; 361/752
(58) Field of Search ................................ 361/807, 802, 361/801, 758, 753, 752, 742, 736, 728, 748, 749, 789, 730, 803, 810, 679, 715, 735

(56) References Cited

U.S. PATENT DOCUMENTS

| | | | | |
|---|---|---|---|---|
| 3,904,934 A | * | 9/1975 | Martin | 317/101 |
| 4,375,290 A | | 3/1983 | Zucchi et al. | 277/12 |
| 4,441,140 A | * | 4/1984 | Richard | 361/386 |
| 4,493,010 A | | 1/1985 | Morrison et al. | 361/385 |
| 4,630,355 A | * | 12/1986 | Johnson | 29/575 |
| 4,811,165 A | * | 3/1989 | Currier et al. | 361/386 |
| 5,051,097 A | * | 9/1991 | Miles et al. | 439/75 |
| 5,229,916 A | * | 7/1993 | Frankeny et al. | 361/386 |
| 5,544,412 A | | 8/1996 | Romero et al. | 29/832 |
| 5,701,233 A | | 12/1997 | Carson et al. | 361/735 |
| 5,790,380 A | * | 8/1998 | Frankeny | 361/735 |
| 6,040,701 A | * | 3/2000 | Swafford et al. | 324/754 |

\* cited by examiner

Primary Examiner—Jayprakash N. Gandhi
Assistant Examiner—Hung Bui
(74) Attorney, Agent, or Firm—Marsh Fischmann & Breyfogle LLP

(57) ABSTRACT

Electronic processing components which may be employed in an aircraft or space craft may be packaged in extreme density module. The module may include a high density interconnect module which provides for the interconnection and routing of data and other signals from processing. On the exterior of the HDI module may be a number of conductive contacts which may be used to receive and transmit signals from the HDI module. An interposer device may be provided which also includes conductive contacts which may be aligned with the conductive contacts on the HDI modules. Data and other signals may be routed through the interposer to a motherboard which also includes external contacts which are laid out in a pattern to match those on the interposer. The components described above may be placed between a base and frame bracket and a compressive force applied in order to establish and maintain the electrical contacts. A flexible input-output line may then run from the motherboard device in order to route and receive signals from external systems.

26 Claims, 12 Drawing Sheets

EXTREME DENSITY PACKAGING FOR ELECTRONIC ASSEMBLIES

FIELD OF THE INVENTION

The invention described herein relates to the packaging of electronic processing components in a computer system, and more specifically to an apparatus which provides for high density packaging of electronic processing components where the electronic assemblies are relatively simple to construct.

BACKGROUND OF THE INVENTION

As airplane and spacecraft have become more technologically sophisticated, there has been a greater need to include more electronic components on the vehicles. For example, avionics systems which are employed to control the flight and other aspects of the aircraft and/or spacecraft, require a great number of electronic processing components, as well as input/output and interconnected signal lines so that the various components may communicate.

Typically, an aircraft or spacecraft will carry a number of "black boxes" which includes circuit cards designed to perform particular functions. A number of circuit cards may be positioned in each black box and soldered connections provided from each circuit card to the components with which it is to communicate. These soldered connections may be made to a motherboard, which in turn provides for communications from a particular black box with any number of remotely located systems.

SUMMARY OF THE INVENTION

The inventor has recognized that certain difficulties may exist with regards to using black boxes on platforms such as aircraft or spacecraft. These include the amount of space these components take up as well as the difficulty in manufacturing and maintaining these devices. The inventor has further recognized, that an electronic assembly may employed which performs essentially the same functions as the traditional black box but is compact and easy to fabricate and repair. In particular, the inventor has recognized that the use of certain devices which establish electrical connections through use of compressive forces instead of soldering and other traditional interconnect techniques, would be advantageous and would also save space, especially in space limited areas such as those on the vehicles described above.

The applicant's invention includes an apparatus for providing electrical interconnections between electronic processing devices. In the invention described herein, the electronics devices may include processing components such as circuit chips. These processing devices may be packaged in an electronics module which includes at least one external electrical contact. This contact would provide for the routing of electrical signals to and from the processing devices. The apparatus described herein may further include an external signal routing device, such as a motherboard device which provides electrical connection between the electronics module and any external systems or components. This motherboard device may also include at least one exterior electrical connection.

In order to provide for electrical connection between the electronics module and the motherboard device, an interposer device may provided which include at least one conductive pathway which may route electrical signals from one component to the other. In particular, the interposer may include exposed electrical connections which pass from one side of the device to the other. One end of a conductive pathway may be placed in electrical connection with the exterior electrical contact for the electronics module, and the other end of the conductive pathway placed in electrical contact with the exterior electrical contact of the motherboard device such that electrical signals may be conducted between these components. In order to maintain the electrical connection, a compressive force may be exerted on both the motherboard device and the electronics module which in turn compresses the interposer device and its conductive pathways. While the compressive force is maintained, a conductive pathway is provided between these components.

In order to apply the compressive force, a bracket assembly may be provided in which the above described components, when placed in a stacked configuration, may be compressed together in order to establish the electrical connections. The bracket assembly may further provide for limiting any relative motion of the components to which the compressive force is being applied, in order to maintain the integrity of the electrical connections.

The electronics module may comprise a device such as a high density interconnect (HDI) module or a multi-chip module (MCM). The HDI may include a ceramic carrier which includes a number of cavities which are sized to receive a variety of submodules. The submodules may contain a variety of circuit elements, such as circuit dice, which include a processing components. Interconnections are provided within the submodules and between the submodules for communications. Included on the exterior surface of the HDI module may be a number of electrical contacts laid out in a predetermined pattern. These contacts may be made of a electrically conductive material and protrude slightly from the surface of the carrier.

The interposer device may be a relatively thin sheet of hard plastic through which a number of electrically conductive pathways may pass. The traces begin by protruding slightly from one surface of the plastic sheet, run through the thickness of the sheet, and then protrude on the other side. The conductive traces are incorporated into the interposer in a pattern such that a particular conductive trace will contact a particular electrical contact on the HDI module when these components are stacked in the electronic assembly described herein.

The motherboard device, may also include a number of external electrical contacts which are laid out in a pattern to match the conductive traces which protrude from the interposer device. The motherboard device may be a layered Kapton structure which includes a number of conductive internal circuit traces which route signals from the external electrical contacts to a remotely located devices and/or systems. The motherboard device may include rigid and flexible portions, wherein the rigid portion may be used within the assembly itself in order to establish and maintain electrical contacts, while the flexible portion may be outside the electronic assembly and is used to establish electrical connections with other devices.

The means to apply and maintain a compressive force on the components of the electronic assembly may comprise a bracket assembly. This bracket assembly may include a base frame which is configured to receive the electrical components of the assembly and provide the necessary restraints such that relative movement between the components is limited. Attachment means may also be provided in this base frame for attaching the electronic assembly to any structure in its operating environment. Also included in the base frame may be a number of holes through which connectors such as bolts may pass. In this configuration, some or all of the electronic components in this assembly include connection holes which align with the connection holes through the base frame when these items are in a stacked configuration. Alternatively, the base frame may also be configured to receive and restrain one or more electronic components without the use of connectors.

Also included in the bracket assembly may be a frame clamp which is positionable adjacent to the stacked electronic components opposite the base frame. This frame clamp may also includes connection holes which align with the connection holes through the electronic components as well as the base clamp. Once the electronic components are in a stacked configuration and the connection holes aligned, a bolt connector may be run through the frame and base clamps as well as the electronic devices, and some sort of fastener device such as a nut which threads onto the bolt may be applied and tightened down. The nuts on the connector bolts may be tightened to the point such that a desired compressive force is applied to the electrical components of the assembly. This compressive force should be sufficient to establish and maintain electrical connections, as well as limit relative movement of the components when the electronic assembly is in operation.

During the construction of the assembly, alignment pins may also be employed to further limit any relative motion between the various electronic components. Additional holes may be provided through the motherboard, interposer, and electronics module, and a specially configured hole included in the base clamp. The alignment pin may include a specially configured head at one end which is positioned in the specially configured hole in the base frame. During the fabrication of the assembly, each electronic component may be threaded onto the alignment pin and once the frame clamp is positioned and tightened down, this alignment pin may act to limit the movements of the electronic components.

Alternatively, the electronic assembly may be constructed to employ ballard pins instead of threaded bolts and nuts. In this configuration, the frame clamp is configured with special connecting hole and slot especially designed to receive a ballard pin. After the electronic components are stacked in the base clamp, and the ballard pin run through the connecting holes, the frame clamp may be placed over the ballard pins and then slid into the locking position, thus applying a compressive force to the electrical components of the assembly.

In yet another configuration, the flexible connector running from the motherboard device may be specially configured such that connections are established with a plurality of motherboards. In this configuration, connection lines for each motherboard may be routed to a common portion of the flexible connector which then provides for the routing of the electrical signals to other remotely located systems. Specially configured flexible portions may be included in the I/O connector such that this component may be shaped in a desired fashion in order to establish connection or conserve space.

DETAILED DESCRIPTION

Figure 1:
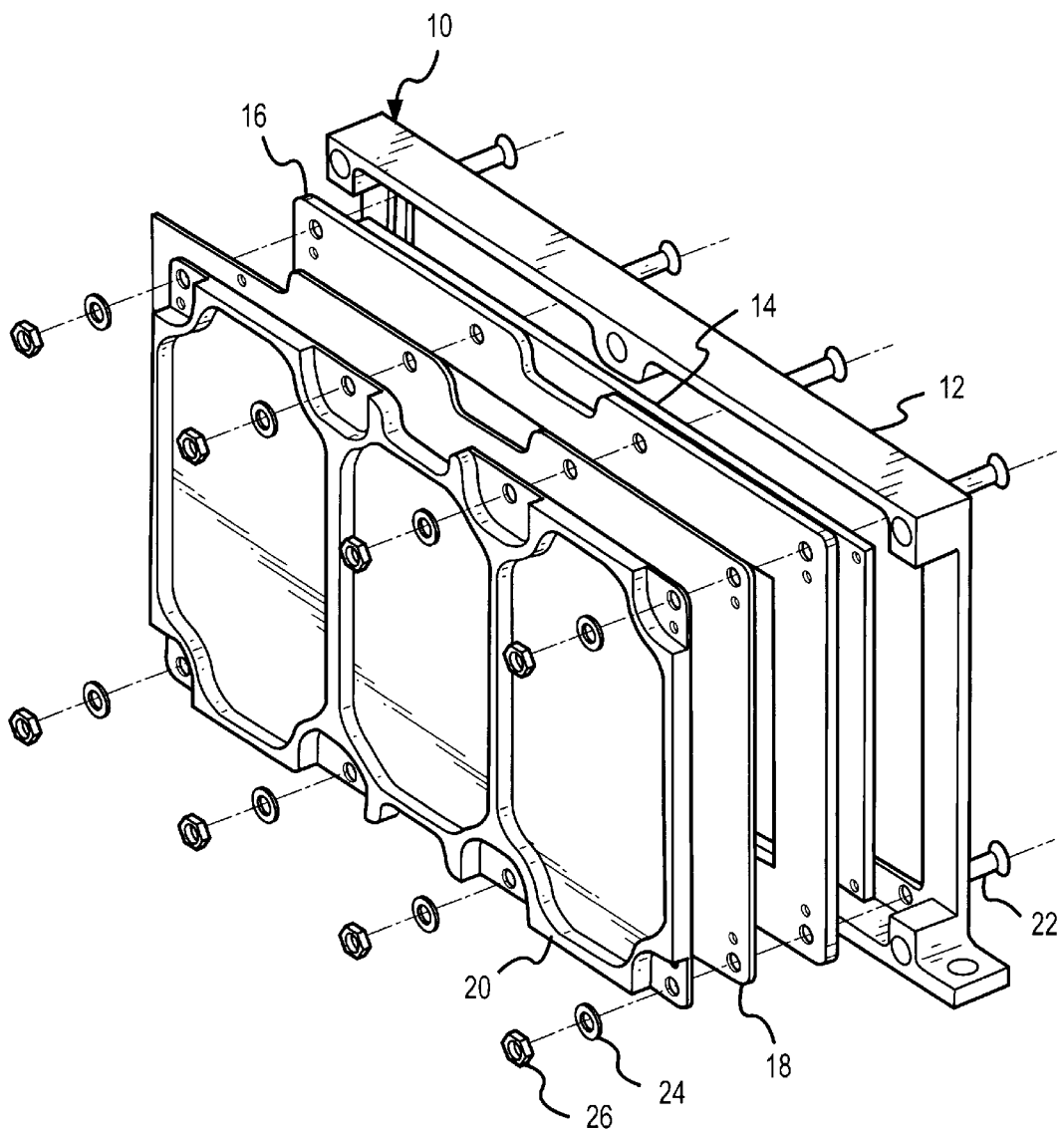
FIG. 1 discloses an exploded view of the electronics assembly.

Disclosed in FIG. 1 is an exploded view of the electronic assembly 10 described herein. The electronic assembly 10 is a specially designed apparatus which is configured to hold a number of processing elements which may be used in avionics and other systems for aircraft and spacecraft. The electronic assembly may include a number of electronic processing components as well as conductive pathways for routing signals to and from the components. The electronic assembly disclosed in FIG. 1 includes a high density interconnect (HDI) module 14 which is employed to hold the electronic processing components, such as semi-conductors chips, as well as provide the necessary interconnections and input lines. Other components such as multi-chip modules (MCM) may be used to hold the electronic processing components and positioned in the electronics assembly. The HDI and MCM perform the function of what circuit cards assemblies previously performed, but does this in a more compact fashion. A more detailed description of the HDI module 14 will be provided below.

Adjacent to the HDI module 14 is the interposer 16. The interposer 16 acts as a signal pathway for conducting signals between the HDI module 14 and the motherboard 18. The motherboard 18 provides for the routing of electrical signals to and from components in the electronic assembly. Shown in FIG. 1 is the substantially rigid portion of the motherboard 18 which contacts the interposer 16. The motherboard 18 may include a flexible portion (not shown in this view) which is used to connect to other electronic assemblies, and/or remotely located systems.

Adjacent to the HDI module 14 is base frame 12 which is configured to receive the HDI module, the interposer, and the motherboard when in a stacked configuration. Adjacent to the motherboard 18 is the frame clamp 20 which is also configured to align with and be received by the base frame 12. As can be seen, each of the components included in the electronic assembly include a number of connection holes through which fasteners 22 may pass when the entire assembly is in the stacked configuration. All parts of the assembly may then be compressed and held together using the washer 24 and nut 26 which may be threaded and tightened onto bolt 22. Once this assembly process is complete, in the manner described below, electrical connections are established between the components contained therein, such that data and other signals may pass to and from the electronic assembly.

The electronic assembly described above may be employed in a number of environments including aboard spacecraft and aircraft. As is known, electronic processing components for aircraft or spacecraft are provided through use of circuit card assemblies which are packaged in "black" boxes. Various connections may be established between the boxes and other systems on the craft. Because space is at a minimum on an aircraft or spacecraft and lightweight components are desirable, it is becoming increasingly difficult to find enough sufficient space to locate "black" boxes, especially in light of the increases in the number of systems which an aircraft or spacecraft can employ and the number of functions performed by the particular systems.

One solution to providing a more lightweight computing system has come through the use of HDI modules or multi-chip modules (MCM's). These HDI modules are used to provide high density interconnects between electronic elements. The HDI may comprise a ceramic carrier which includes a number of cavities which are sized to receive a variety of submodules. The submodules are constructed to hold a variety of circuit elements, such as circuit dice, and provide the conduction paths for establishing interconnections between these chips. These circuit elements are attached on one side of the submodule and electrical contacts are provided on the opposite side. Upon installation into the cavity in the carrier module, the submodule is flipped such that the electrical connections are exposed. Once in the cavity a layer of flex circuitry is applied over the submodule and the ceramic carrier in order to establish electrical connections between the electrical elements in the submodules as well as components external to the ceramic carrier.

Figure 2:
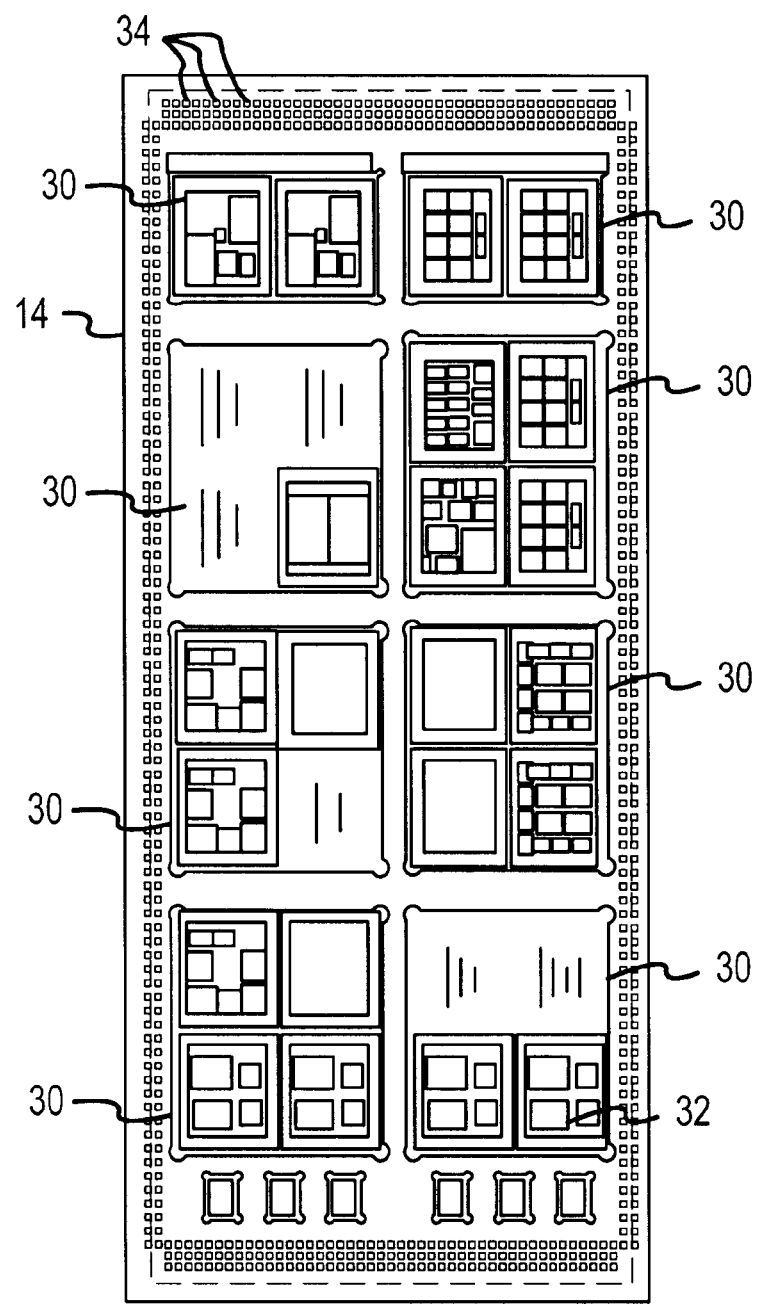
FIG. 2 discloses a top view of the high density interconnect module which includes the external electrical connectors.

Disclosed in FIG. 2 is a top view of the HDI module 14. As can be seen, the HDI module 14 includes a number of submodules 30 which further include a number of processing chips 32. In order to communicate outside the module, data and other signals may be routed through the conductive connections 34 which run along the outer surface of the HDI module. These connections are made of a conductive metal, and protrude slightly above the surface of the HDI module. The HDI module 14 is sized such that it may fit within the recesses of bracket 12 during fabrication of the electronic assembly. The tolerances of the bracket and HDI module should be such that each component is sized so that the HDI module will not significantly move when the assembly is in an operating environment, and the coefficients of expansion of the two components may be compatible to avoid excess movement or inducement of stress when heating or cooling of the electronic assembly occurs.

Figure 3:
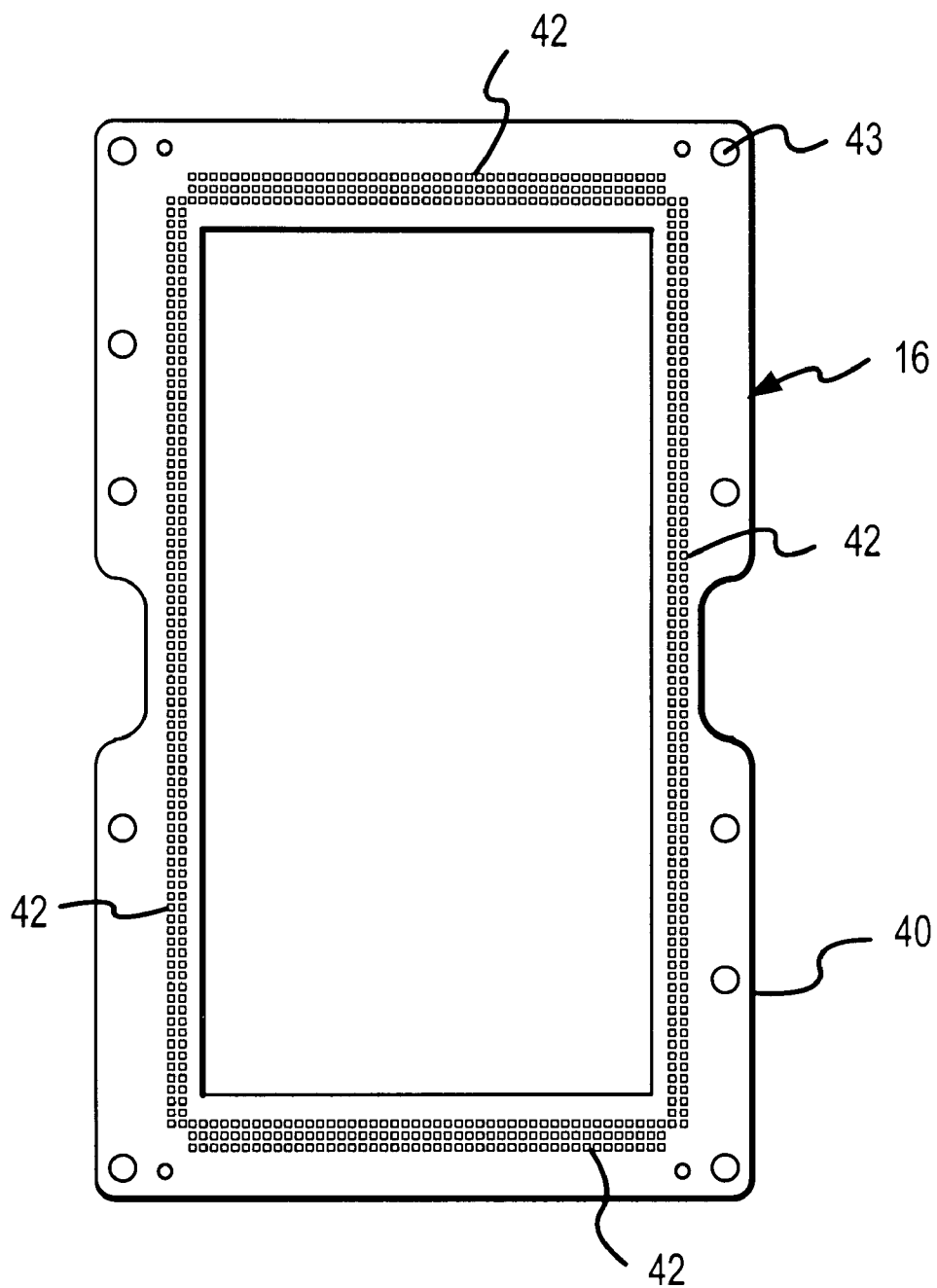
FIG. 3 discloses a top view of the interposer including the external electrical connections, FIG. 4 discloses a top view of the motherboard including electrical connections and I/O flex connector.

Disclosed in FIG. 3 is a top view of the interposer 16. As can be seen in FIG. 1, when the electronic assembly is constructed, the interposer is positioned between the HDI module 14 and the motherboard 18. In the configuration shown in FIG. 3, the interposer body 40 is constructed of a relatively thin sheet of hard plastic. Passing through the interposer are a number of electrical contacts 42 which provide for the conduction of electrical signals from one side of the interposer to the other. The opposite side of the interposer (not shown) is substantially identical to the side shown in FIG. 3, which includes the same pattern for the electrical contacts 42. The electrical contacts may be made of a copper beryllium which is plated with gold and includes compressive characteristics such that when pressure is applied to the conductive contacts, an expansive force is generated between the contacts and any bodies which may be in contact such that an electrical connection may be maintained.

Certain considerations need to be accounted for with regards to the design of the interposer. As a first consideration, the electrical contacts may be laid out in such a pattern that they match the contact pattern disclosed for the HDI module 14 shown in FIG. 2. The interposer must be designed in a fashion such that there is not significant expansion or contraction of materials during changes of heat and it must be sized so that it fits within the retaining brackets once the assembly is fabricated. The interposer further includes a number of connection holes 43 through which the assembly pins may pass.

Figure 4:
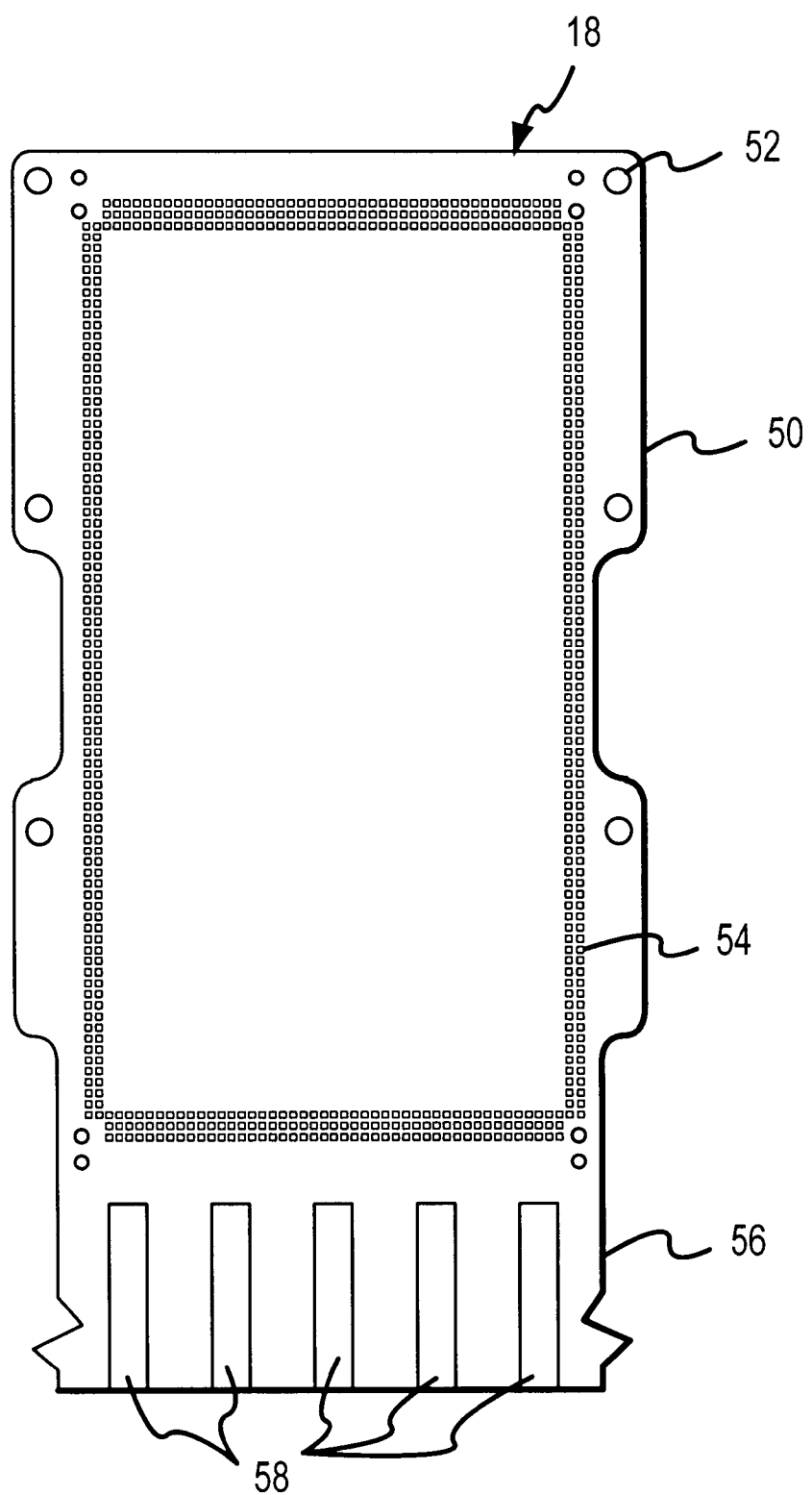

Disclosed in FIG. 4 is a top view of the motherboard 18. The motherboard 18 may be constructed of layered Kapton, and embedded within the motherboard are a number of conductive contacts and circuit traces which are employed to carry signals to and from the electronic assembly. The motherboard may comprise a rigid portion 50 and a flexible portion 56. The rigid portion 50 will contact the interposer in the electronic assembly, while the flexible portion 56 will be used to establish connections with remotely located systems and/or devices.

The motherboard includes a number of electrical contacts 54 which protrude from the surface of the motherboard. These electrical contacts may also be constructed of conductive metal, and possess the necessary compressive characteristics such that when a force is applied to the contacts, they will maintain electrical contact with whatever surface or object is applying a force. Circuit traces within the motherboard (not shown) may conduct electrical signals to and from the contacts. These circuit traces 58 pass through the flexible portion and carry electrical signals to and from other systems and/or devices.

As with the electrical contacts on the interposer, electrical contacts 54 on the motherboard are laid out such that they align with corresponding electrical contacts on the interposer. The motherboard is constructed of a material whose coefficient of expansion is compatible with the other components in the electronics assembly. Further, the motherboard is shaped such that it may closely match the interior shape of the bracket such that when the electronic assembly is fully assembled, there is limited movement of this element due to any external element such as vibration. The motherboard further includes a number of connection holes 52 through which the assembly pins may pass.

Figure 5:
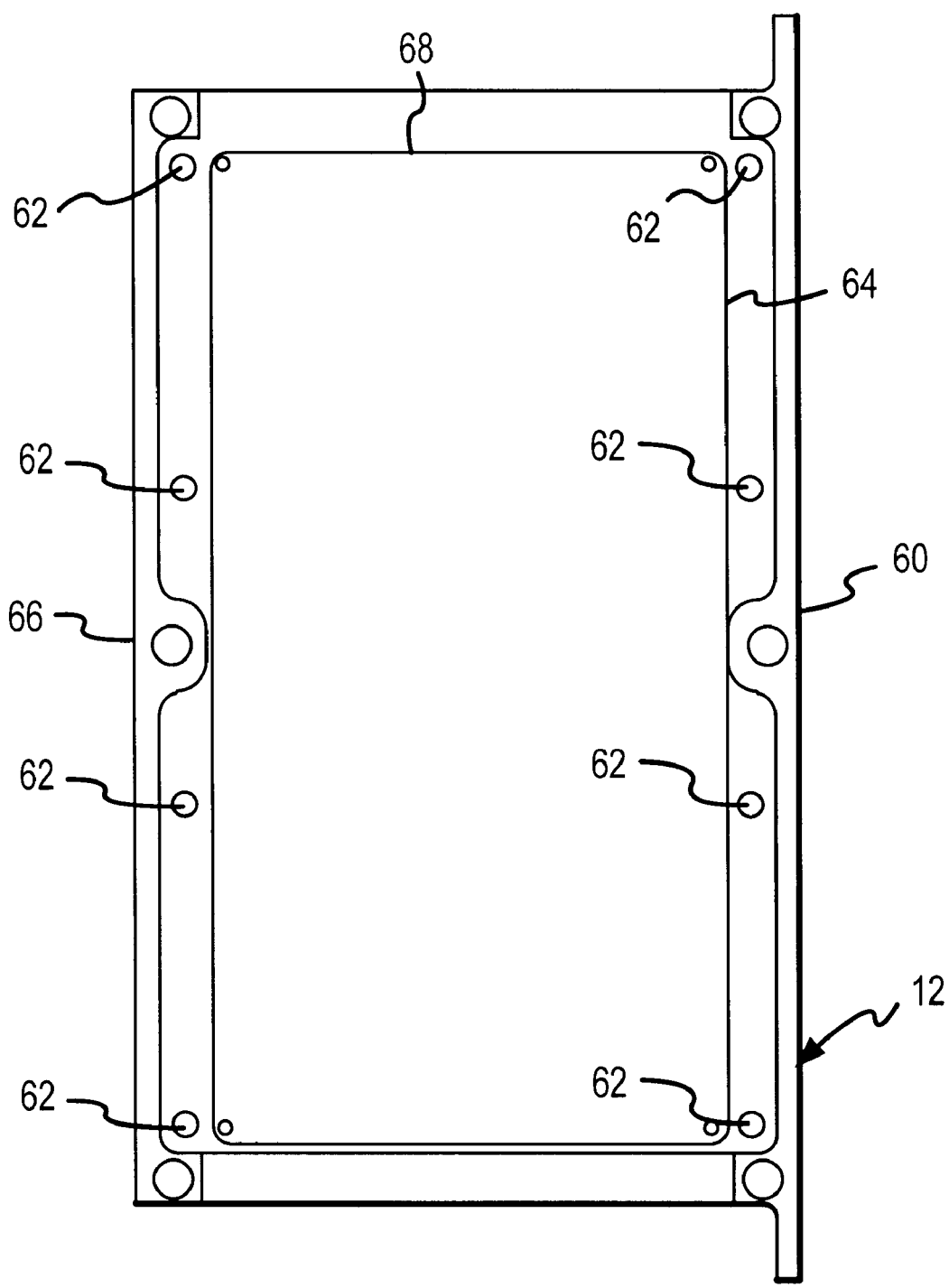
FIG. 5 discloses a view of the base frame.

Returning again to FIG. 1, it is seen that the electronic assembly also includes the base frame 12 as well as the frame clamp 20. A top view of the base clamp 12 is disclosed in FIG. 5. The base frame may be made of machined aluminum or any other suitable material. The base frame may include an attachment flange 60 which may be employed to connect the electronic assembly to a structure within the operating environment. Attachment holes may be included in the flange for this purpose. The flange 60, in conjunction upper flange 66, also provide for alignment for the electronic components when positioned within the base frame. These parts may be manufactured with tight tolerances such that there is very little movement of the electrical components when the assembly is completed. Also machined into this base frame may be a pocket 68 which is specially constructed for receiving the HDI module. The depth of this cavity may be the same as the width of the HDI module and the machining may be of such minimum tolerance that there is little if any movement of the HDI module when placed in the cavity. The base frame 12 may be constructed of a material which has a coefficient of expansion which is compatible with the other components in the electronic assembly such that there is a minimum of relative movement of the components during heating and cooling of the assembly. Also included in the base frame are connection holes 62 through which nut and bolt fasteners may be positioned when the electronic assembly is assembled.

Figure 6:
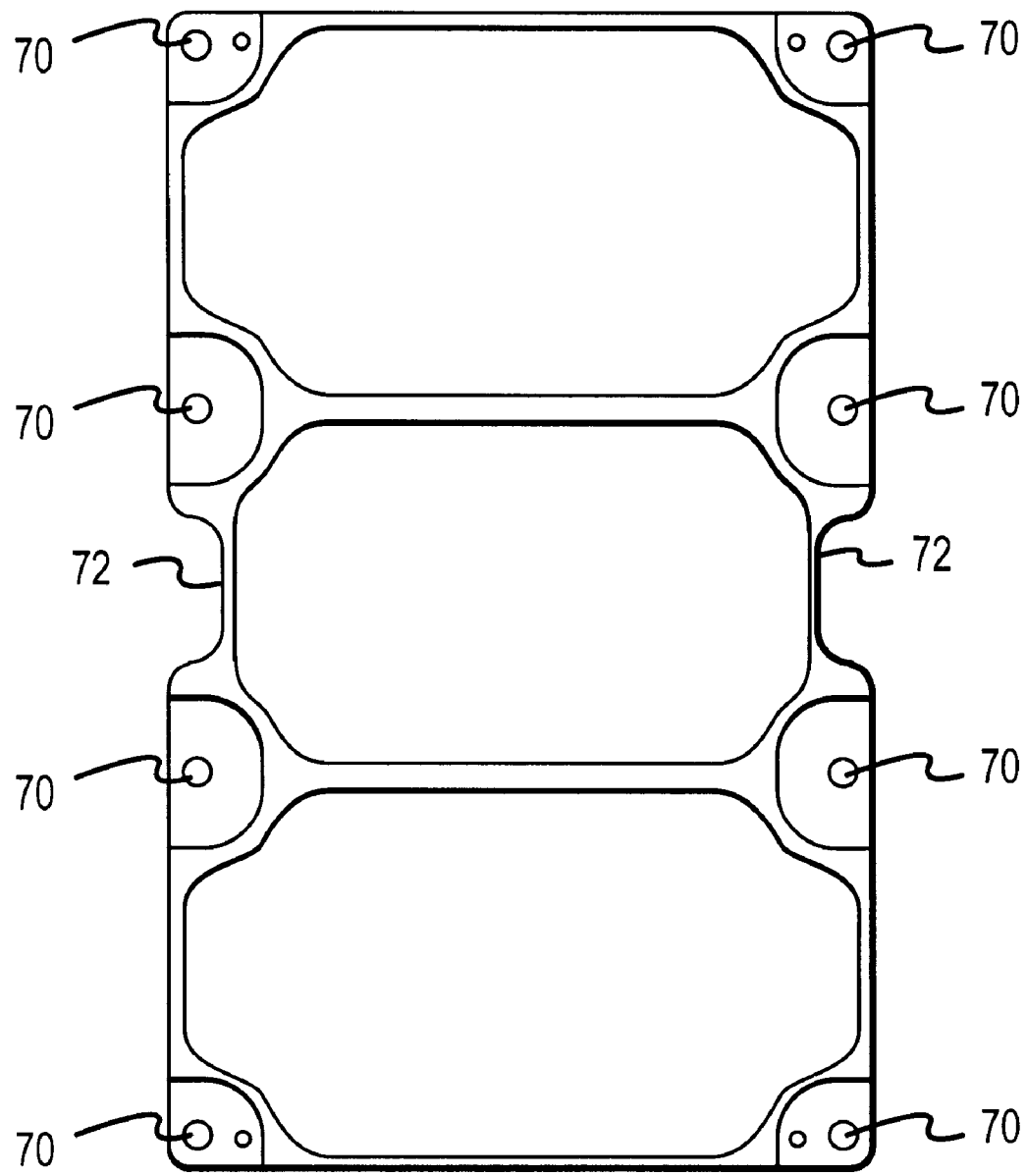
FIG. 6 discloses a view of the frame clamp.

Disclosed in FIG. 6 is a top view of frame clamp 20. When the assembly is constructed, the frame clamp 20 is positioned opposite the electronic components of the assembly from the base clamp. This part may also be made of machined aluminum or any other material which has a compatible coefficient of expansion with the other elements of the assembly. The frame clamp may include a flat side (not shown) which contacts the motherboard. Also included are connection holes 70 through which the nut and bolt fasteners may be passed through. Finally, inset 72 may also be included in order to closely mate with the base frame when compression forces are applied to the electronic components.

As was described above, each of the electronic components (the HDI module, the interposer, and the motherboard) include external conductive contacts which must be properly aligned during construction of the assembly and then kept in position once the electronic assembly is in operation. The connections are first established during the assembly process. In order to assemble the described components, the HDI module is initially placed in cavity 68 of base frame 12 such that the electrical connections are exposed. In order to restrict movement of the HDI module in the assembly and to provide enhanced heat conduction to the frame, an adhesive may be used to bond the HDI module to the surfaces of the cavity. At this point, the interposer may then be placed upon the HDI module such that the corresponding electrical connections on both parts are in contact. The flanges 60 and 66 of the base frame provide for the proper electrical alignment between these components. Once the interposer is contained within the base frame, the motherboard may then be positioned on top of the interposer. The motherboard is also properly aligned through use of the flanges. The exposed electrical connections on the motherboard will align with the electrical connections on the interposer. Once the motherboard is in place, the frame clamp may then be positioned.

The frame clamp is also positioned within the recesses created by the flanges on the base clamp. Once the frame clamp has been positioned, the fasteners 22 may be run through the connector holes provided in the interposer 14, the motherboard 18, and the frame clamp 20. Once the fasteners are run through these holes, the washer and nut combination, 24 and 26 respectively, may then be threaded on and tightened down such that a desired amount of compressive force is created between the electronic components. This force applied should be sufficient to maintain electrical connections between the various corresponding electrical contacts on the electronic components, such that in the operational environment of an aircraft or spacecraft, signal integrity is maintained.

The design described herein offers the advantage that it is easily repairable, in that if the HDI module or any other component needs to be replaced, the fasteners are removed and the desired component may be then removed and replaced. Once the new component is installed, the fasteners may be reinserted and tightened to the desired compressive force. All these connections are established without the use of soldered leads or the requirement that the assembly be hermetically sealed.

Figure 7:
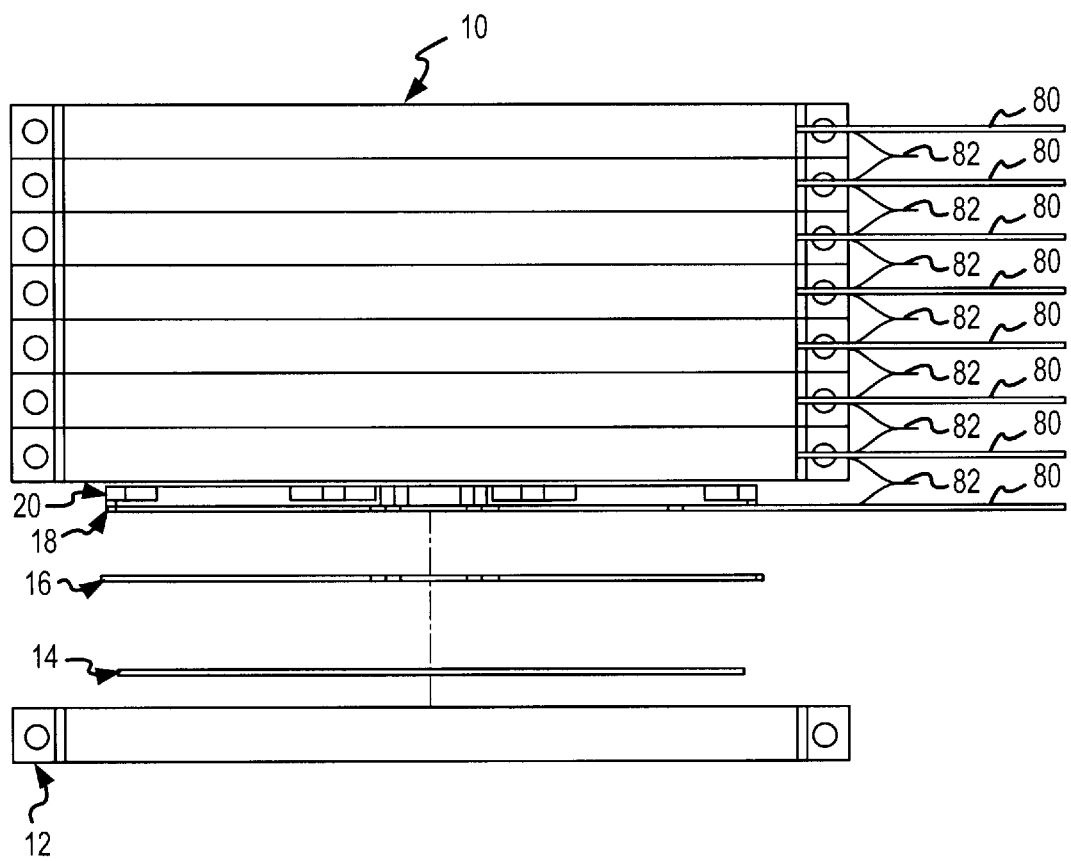
FIG. 7 discloses a side view of a plurality of electronic assemblies connected by I/O tabs.

The design described herein offers the further advantage that through use of the flexible portion of the motherboard, interconnections may be established between multiple electronic assemblies. An example of such a configuration is shown in detail in FIG. 7. As can be seen, a number of electronic assemblies are stacked together. An exploded view of one assembly is also disclosed to illustrate how the assemblies are constructed and from where the flexible connector extends.

Extending from each electronic assembly is a flexible portion 80 for each motherboard. As was described above, these flexible portion 80 provide for the receipt and transmission of data and other signals to other electronic components. These electronic assemblies may be connected together through use of the flanges provided in the base clamp. In order to transmit signals between the electronic assemblies in a particular stack, a signal tab 82 is provided which extends from the various flexible portions. The tab 82 includes conduction lines which tie into the conduction lines running through the flex portion. The connection may be established through use of a solder or adhesive connection. Each flexible portion may be designed to include a tab, and in the situations where a tie-in connection is desired, the desired circuit traces may then be connected.

In another embodiment of the invention, interconnection between the various electronic assemblies in a stack or other configuration may be provided through use of a single motherboard which includes a number of flexible portions such the device may be positioned in a desirable configuration. As was described above, an electronic assembly includes its own motherboard with a flexible portion which extended outward from at least one side. Because of the flexibility of the design described herein, the flex connector may extend out of one or more sides of the assembly, and may extend along an entire side of an assembly or just a portion.

In one configuration, the electronic assemblies may be positioned in a tiled fashion, that is, each electronic assembly is layed flat against a mounting surface such that a maximum amount of the external surface of the assembly is in contact with the mounting surface. In this situation, a single motherboard may be employed to interconnect each of the assemblies. The flexible portions of the motherboard may extend out any side of the assemblies, and provide for the interconnections. Additional flexible portions may also be employed to connect the electronic assemblies to a remotely located system.

Figure 8A:
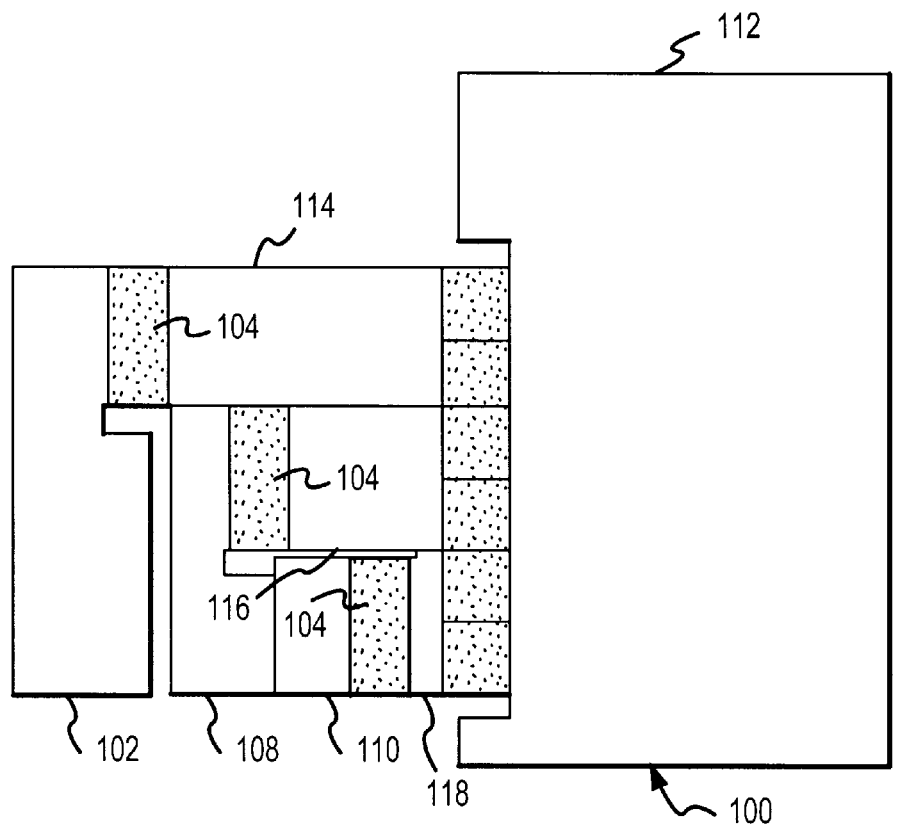
FIGS. 8a and b disclose views of the motherboard and flex connector according to an alternative embodiment of the invention.

Disclosed in FIGS. 8a and b is an alternate configuration for the motherboard which provides for the stacking and interconnection of the electronic assemblies. In the configuration shown in FIG. 8a, a flat plan view of a motherboard 100 is provided. Included in the three dimensional motherboard are flexible portions 102, 108 and 110. The motherboards are constructed in substantially the same fashion as that described previously in FIG. 4, including the external contacts as well as circuit traces running through motherboard from the external contacts. The motherboard includes a main section 112 from which arms 114, 116 and 118 extend to ends 102, 108, and 112. On either end of the arms are flex portions 104 which may be manipulated in a desired configuration.

Figure 8B:
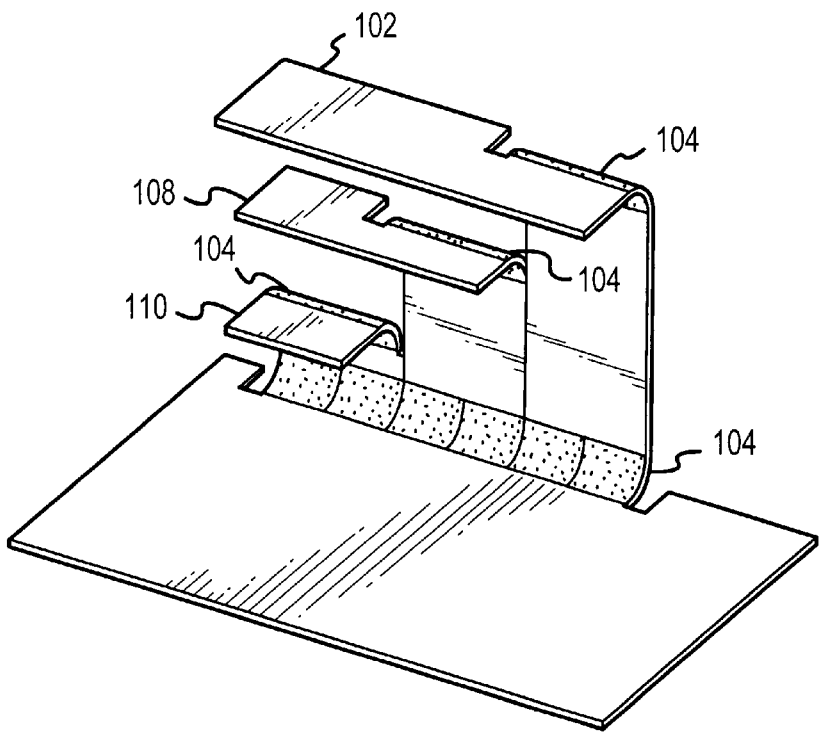

A possible shape for the three-dimensional motherboard is disclosed in FIG. 8b. As can be seen, bends are induced in the flexible sections. In this configuration, the ends may be inserted in the electronic assembly and the flexible portions may bend around one or more electronic assemblies. By folding up the three-dimensional motherboards in the flexible portions, a stacked structure is created. The configuration shown also provides the functionality to employ the tabs discussed above for interconnections between electronic assemblies.

Figure 9A:
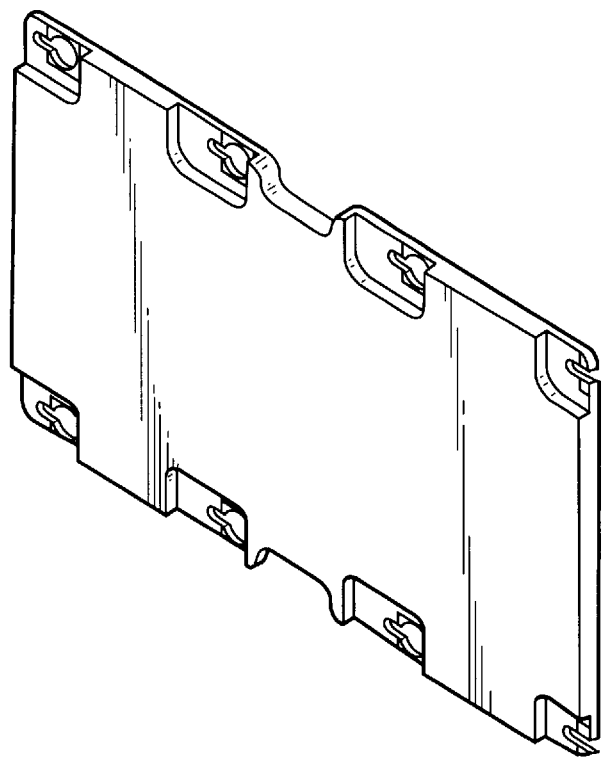
FIG. 9 discloses an alternate configuration of the frame clamp.
Figure 9B:
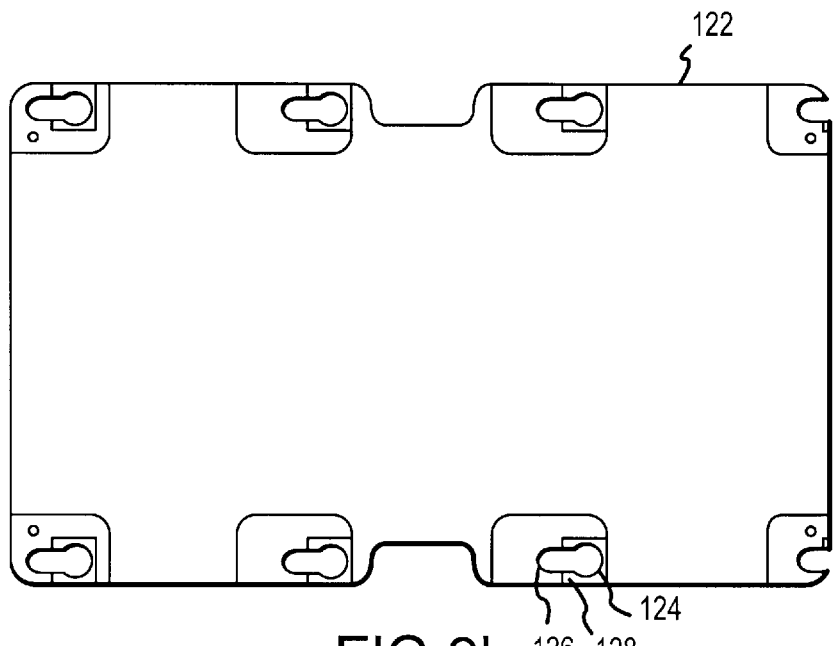
Figure 9C:
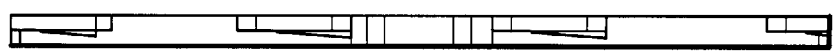
Figure 10A:
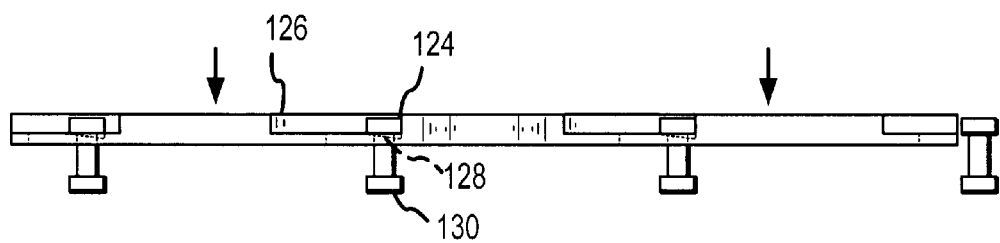
FIGS. 10a and b disclose side views of the frame clamp in operation with the ballard pin.
Figure 10B:

An alternate method for connecting the portions of the electronic assembly together is disclosed in FIG. 9. Shown in particular is an alternate configuration for frame clamp 120. Included in the frame clamp are a number of connection holes 124 which include a slot 126 which extends from the hole, as well as a small ramped area 1 128. This ramped area 130 can be better viewed in the cross-sectional view provided in FIGS. 10a and b. In the previously described configuration, the fasteners used to apply a compressive force to the electronic assembly employed a threaded bolt with a washer and nut assembly. In this configuration of the invention, a ballard pin 130 may be employed in order to lock the components of the electronic assembly together. As seen in FIG. 10a, a ballard pin 130 may be passed through all the connection holes for the other components of the electronic assembly and then through the main portion of the connector hole 124 for the frame clamp. Once all the ballard pins have been inserted, the frame clamp may be pushed in one direction such that the head of the ballard pin slide up the ramp in the frame clamp and engage in the slot portion 126 of the connection hole. The sliding of the head up the ramp provides for the exertion of the compressive force on the electronic assembly. This force also provides for the locking of the assembly in place. The electronic assembly may be disassembled by performing the above-described steps in reverse order.

Figure 11A:
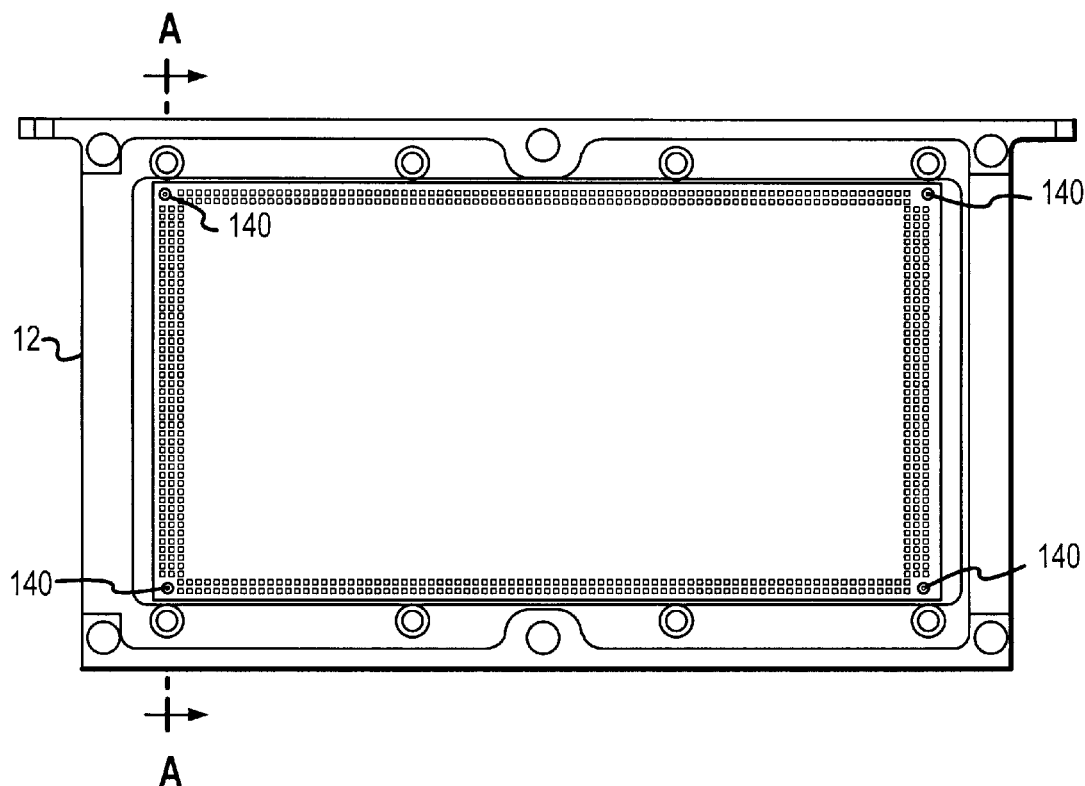
FIGS. 11a–d disclose a top and cross sectional views of the electronic assembly which includes the alignment retaining pin.
Figure 11B:
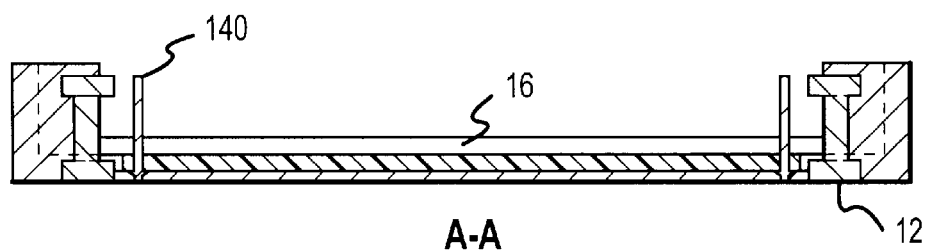
Figure 11C:
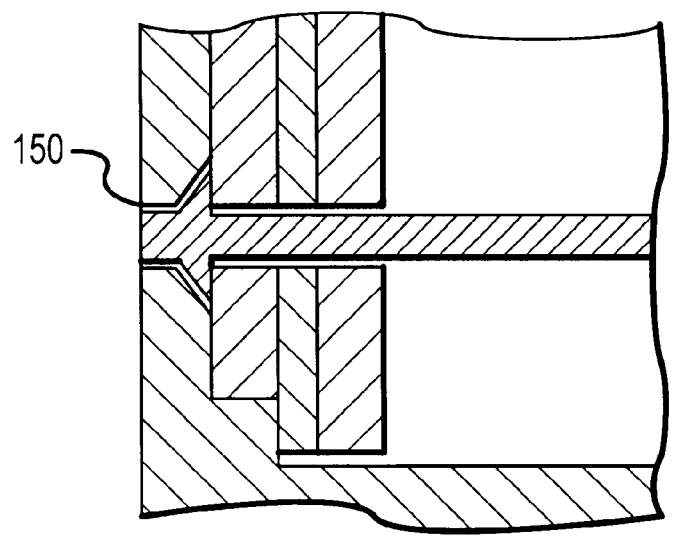
Figure 11D:
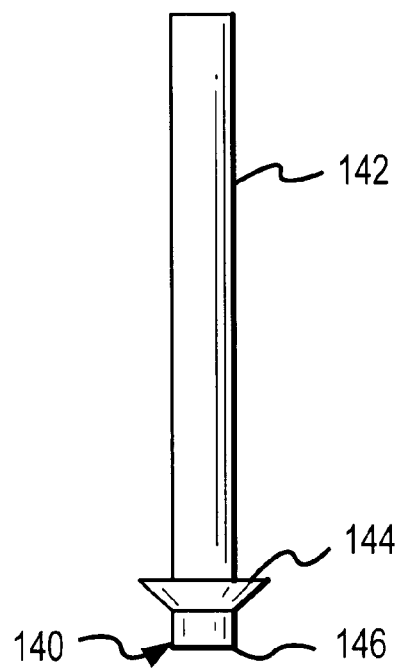

In yet another configuration of the invention, an alignment pin may be employed in the electronic assembly to help maintain alignment of the electronic components in the assembly such that there is no interruption in the electrical connections. Disclosed in FIG. 11a is a top view of the electronic assembly 10 with the frame claim removed including the alignment pin 140. In this configuration, additional connection holes are provided through the electronic components in the four corners of each component. Included in the base frame is a specially machined hole which matches the shape of one end of the alignment pin. As can be seen in FIG. 11d, the pin includes a body portion 142, a flanged area 144, and head 146. As can be seen in FIG. 11c, the base frame is specially configured with a hole 150 specially adapted to receive the flanged and head area of the pin 140. During manufacture of the assembly described herein, the pins are first placed in the four connection holes especially adapted for this purpose. Afterwards, each component of the electronic assembly is placed over the pins such that the pin passes through the designated connection holes. The pin is only long enough to extend into a portion of the motherboard and will not interfere with the frame clamp when a compressive force is exerted on the assembly. Once, assembled, because of the shape of the head of the pin, excessive movement in the lateral direction of the components through which the pin passes is further limited. This is done without unduly limiting movements of the components which may occur during heating and cooling of the electronic assembly.

The foregoing description of the present invention has been presented for purposes of illustration and description. Furthermore, the description is not intended to limit the invention to the form disclosed herein. Consequently, variations and modifications commensurate with the above teachings, and the skill or knowledge of the relevant are, within the scope of the present invention. The embodiments described hereinabove are further intended to explain best modes known for practicing the invention and to enable others skilled in the art to utilize the invention in such, or other, embodiments and with various modifications required by the particular applications or uses of the present invention. It is intended that the appended claims be construed to include alternative embodiments to the extent permitted by the prior art.

What is claimed is:

1. An apparatus for packaging and providing interconnections to an electronics module comprising:

an electronic interposer device with first and second sides, where the interposer includes at least one interposer electrical contact which passes from the first side to the second side, the at least one electrical contact is configurable so that when a compressive force is applied to the at least one interposer electrical contact, an expansive force is generated within the at least one electrical contact so as to maintain an electrical connection, the at least one electrical contact is positionable in electrical contact with at least one electrical contact for the electronics module;

a motherboard device which includes at least one second electrical contact which is positionable in contact with the at least one conductive pathway, the at least one second electrical contact is configurable so that when a compressive force is applied to the at least interposer electrical contact, an expansive force is generated within the at least one electrical contact so as to maintain an electrical connection, where the mother board device further includes conduction lines which route the signals to and from remotely located electronic systems; and a bracket assembly employable to hold and apply a compressive force to the electronics module, the electronic interposer, and motherboard, such that the compressive force is sufficient to establish and maintain an electrical connection between the electronics module, the electronic interposer, and motherboard.

2. The apparatus of claim 1 wherein the electronics module is a multi-chip module which includes at least one processing chips wherein the at least first electrical connection conducts signals to and from the at least one processing chip.

3. The apparatus of claim 1 wherein the interposer is comprised of a hard plastic sheet through which the at least one interposer contact may pass.

4. The apparatus of claim 3 wherein each of the at least one interposer contacts are positioned within the interposer to align with a particular one of the electrical connections on the electronics module when the interposer and the electronics module are held in the bracket assembly.

5. The apparatus of claim 1 wherein the motherboard device includes at least one flexible portion through which conductive lines are incorporated, wherein the conductive lines conduct the signals to and from remotely located systems.

6. The apparatus of claim 5 wherein the at least one flexible section may further include a conductive tab which is attachable to conductive lines for other electronic components.

7. The apparatus of claim 1 wherein the each of the at least one second electrical connection on the motherboard device are positioned to align with a particular one of the at least one interposer contacts in the interposer.

8. The apparatus of claim 1 wherein the bracket assembly comprises:

a base frame through which connections holes are provide, wherein such frame is configured to hold the electronic assembly, the interposer and the motherboard device in the stacked configuration such that relative movement between the electronic assembly, the interposer and the motherboard device is limited;

a frame clamp through which a further number of connection holes are provided wherein the frame clamp is configured to contact the stacked configuration opposite the base frame, wherein the connection holes through the frame clamp are configured such that there is alignment between the connection holes in at least one of: the interposer, the motherboard device, the electronics module, and the base frame when in the stacked configuration; and a number of bolt type fasteners which may pass through the connection holes when the interposer, the motherboard device, the electronics module, and the base frame are in the stacked configuration, wherein the nuts may be threaded onto the bolts in order to apply a compressive force on the base frame and frame clamp which in turn applies the compressive force to the stacked configuration.

9. The apparatus of claim 8 wherein the connection holes through the frame clamp are configured to receive a ballard pin head and the fasteners used to apply the compressive force to the frame and base clamps, and the stacked configuration are a ballard pin.

10. The apparatus of claim 1 wherein at least one alignment pin is provided which passes through the stacked configuration in order to limit relative movements of the interposer, the motherboard device, the electronics module in the bracket assembly.

11. The apparatus of claim 5 wherein the motherboard device is configured to establish electrical connections with a plurality of interposers.

12. The electronic assembly of claim 11 wherein the motherboard device includes a plurality flexible portions, so that the mother board device may be configured in a desired shape.

13. An electronic assembly comprising:

an electronics module which includes at least one first electrical contact on an external surface;

at least one second electrical contact in electrical connection with the at least one electrical contact which provides for routing of electrical signals to and from the electronics module, wherein the at least one second electrical contact is configurable so that when a compressive force is applied to the at least one second electrical contact, an expansive force is generated within the at least one second electrical contact so as to maintain an electrical connection, wherein the electrical connection is established and maintained through use of a compressive force;

signal routing means with at least one third electrical contact in compressive electrical connection with the at least one, wherein an electrical connection between the at least one third electrical contact and the at least one second contact is established and maintained through use of the compressive force; and means for applying and maintaining the compressive force between the electronics module, the conductive pathway, and the signal routing means.

14. The electronics assembly of claim 13 wherein the electronics module is a multi-chip module which includes at least one electronic processing chip wherein the at least one first electrical connection conducts the electrical signals to and from the at least one electronic processing chip.

15. The electronics assembly of claim 13 wherein the at least one second electrical contact is incorporated in an interposer device, wherein each of the at least one second contacts is positioned to align with a particular one of the at least one first electrical contacts when the interposer and the electronics module are positioned in the assembly.

16. The electronics assembly of claim 15 wherein the signal routing means is a motherboard and each of the at least one second electrical contacts is positioned to align with a particular one of the at least one second contacts when the motherboard and the interposer are aligned in the electronic assembly.

17. The apparatus of claim 16 wherein the motherboard device includes a flexible portion through which conductive lines are incorporated, wherein the conductive lines conduct the signals to and from remotely located systems.

18. The apparatus of claim 17 wherein the flexible portion may further include a conductive tab which is attachable to conductive lines for other electronic components.

19. The electronic assembly of claim 13 wherein the means for applying and maintaining the compressive force is a bracket assembly which comprises:

a base frame through which connections holes are provide, wherein such frame is configured to hold the electronic assembly, the interposer and the motherboard device in the stacked configuration such that relative movement between the electronic assembly, the interposer and the motherboard device is limited;

a frame clamp through which a further number of connection holes are provided wherein the frame clamp is configured to contact the stacked configuration opposite the base frame, wherein the connection holes through the frame clamp are configured such that there is alignment between the connection holes in at least one of: the interposer, the motherboard device, the electronics module, and the base frame when in the stacked configuration; and a number of bolt type fasteners which may pass through the connection holes when the interposer, the motherboard device, the electronics module, and the base frame are in the stacked configuration, wherein the nuts may be threaded onto the bolts in order to apply a compressive force on the base frame and frame clamp which in turn applies the compressive force to the stacked configuration.

20. The electronic assembly of claim 19 wherein the connection holes through the frame clamp are configured to receive a ballard pin head and the fasteners used to apply the compressive force to the frame and base clamps, and the stacked configuration are a ballard pin.

21. The electronic assembly of claim 19 further including at least one alignment pin which contacts the base frame and passes through the interposer, the motherboard device, and the electronics module in order to limit relative movement when the compressive force is applied.

22. The electronic assembly of claim 17 wherein the motherboard device includes a plurality of ends through which a plurality of electrical connections may be established.

23. The electronic assembly of claim 23 wherein the motherboard device includes a plurality of flexible portions so that the flexible connector may be configured in a desired shape.

24. An electronic system comprising:

a plurality of electronic assemblies, wherein each assembly comprises:

an electronics module;

an electronic interposer device including at least one interposer electrical contact, wherein the interposer electrical contact is configurable so that when a compressive force is applied to the interposer electrical contact, an expansive force is generated within the at least one second electrical contact so as to maintain an electrical connection, the at least one interposer contact is positionable in electrical contact with at least one electrical contact for the electronics module, where the at least one interposer electrical contact provides for conduction of the signals to and from the electronics module; and a bracket assembly employable to hold and apply a compressive force to the electronics module and the electronic interposer, such that the compressive force is sufficient to establish and maintain an electrical connection between the electronics module, the electronic interposer, and motherboard; and a motherboard device which includes at least one second electrical contact which is positionable in electrical contact with the at least one interposer contact for each of the interposers, where the mother board device includes circuit traces which route the signals to and from the electronics module and the mother board device is positionable between each of the electronic interposer devices and the bracket assemblies such that the compressive force maintains the electrical connection between the motherboard device and each of the interposer devices.

25. The system of claim 24 wherein the electronic assemblies are positioned in a stacked configurations and tabs are provided from the motherboard device to provide for electrical interconnection between the electronic assemblies.

26. The system of claim 24 wherein the electronic assemblies are positioned in a tiled configuration.

* * * * *